United States Patent
Herman

(10) Patent No.: US 8,264,003 B2
(45) Date of Patent: Sep. 11, 2012

(54) MERGED CASCODE TRANSISTOR

(75) Inventor: Thomas Herman, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/688,338

(22) Filed: Mar. 20, 2007

(65) Prior Publication Data

US 2007/0215899 A1 Sep. 20, 2007

Related U.S. Application Data

(60) Provisional application No. 60/783,934, filed on Mar. 20, 2006.

(51) Int. Cl.
*H01L 29/66* (2006.01)

(52) U.S. Cl. .............. 257/194; 257/E29.246

(58) Field of Classification Search .......... 257/192, 257/194, 195, E29.14, E29.144, E29.246, 257/E29.249
See application file for complete search history.

(56) References Cited

U.S. PATENT DOCUMENTS

| | | | | |
|---|---|---|---|---|
| 6,903,383 B2 * | 6/2005 | Yokogawa et al. | ........... | 257/192 |
| 7,052,942 B1 * | 5/2006 | Smart et al. | ........... | 438/162 |
| 2004/0188761 A1 * | 9/2004 | Koyama | ........... | 257/348 |
| 2005/0051796 A1 * | 3/2005 | Parikh et al. | ........... | 257/192 |
| 2005/0189561 A1 * | 9/2005 | Kinzer et al. | ........... | 257/192 |
| 2006/0060871 A1 * | 3/2006 | Beach | ........... | 257/94 |

FOREIGN PATENT DOCUMENTS

| | | |
|---|---|---|
| JP | 2001-210657 | 8/2001 |
| JP | 2002-076020 | 3/2002 |
| JP | 2008-522436 | 6/2008 |
| WO | WO 2005/079370 | 9/2005 |

OTHER PUBLICATIONS

Tietze, et at., *Halbleiter-Schaltungstechnik*, 12. Auflage, Berlin: Springer, 2002, pp. 316-317.

* cited by examiner

*Primary Examiner* — Victor A Mandala
*Assistant Examiner* — Selim Ahmed
(74) *Attorney, Agent, or Firm* — Farjami & Farjami LLP

(57) ABSTRACT

A merged gate transistor in accordance with an embodiment of the present invention includes a semiconductor element, a supply electrode electrically connected to a top surface of the semiconductor element, drain electrode electrically connected to the top surface of the semiconductor element and spaced laterally away from the supply electrode, a first gate positioned between the supply electrode and the drain electrode and capacitively coupled to the semiconductor element to form a first portion of the transistor and a second gate positioned adjacent to the first gate, and between the supply electrode and the drain electrode to form a second portion of the transistor, wherein the second gate is also capacitively coupled to the semiconductor element. The first gate is connected to an input voltage signal such that conduction of the first portion is based on a value of the input voltage signal and the second gate is connected to a predetermined constant voltage such that the second portion of the transistor conducts until a voltage difference between the predetermined constant voltage and a voltage at the source electrode reaches a predetermined level.

16 Claims, 4 Drawing Sheets

PRIOR ART

MERGED CASCODE TRANSISTOR

CROSS-REFERENCE TO RELATED APPLICATIONS

The present application claims benefit of and priority to U.S. Provisional Application Ser. No. 60/783,934, filed on Mar. 20, 2006, entitled MERGED CASCODE TRANSISTOR (III-NITRIDE, COMPOUND, OR SILICON SEMICONDUCTOR) FOR LOW Qg, FAST SWITCHING AND HIGH VOLTAGE, the entire contents of which are hereby incorporated by reference herein.

The present application is also related to U.S. patent application Ser. No. 11/345,753 entitled III-NITRIDE INTEGRATED SCHOTTKY AND POWER DEVICE filed Feb. 2, 2006, which claims benefit of and priority to U.S. Provisional Patent Application Ser. No. 60/649,393 entitled GaN MONOLITHIC FETKY SYNCHRONOUS RECTIFIER FOR BOOST DIODE filed Feb. 2, 2005, the entire contents of both of which are hereby incorporate by reference herein.

BACKGROUND OF THE INVENTION

The present invention relates to a transistor for use in high voltage, high speed switching applications. More specifically, the present application relates to a merged gate transistor that is useful for high voltage, high speed applications.

FIG. 1 illustrates a schematic representation of a conventional field effect transistor (FET) 1. The FET 1 includes a drain D, a source S and a gate G to control current flow between the drain and the source. When FETs, like FET 1 in FIG. 1 are used in used in large switching applications, for example, in DC-DC power converters, low gate charge/capacitance and low gate-drain capacitance are important parameters in providing high frequency and high efficiency. Large drain-source voltage (Vds) swings during switching create a large "Miller effect" and as a result, excessive switching losses.

In addition, high dV/dt changes at the drain (D) may result in a voltage transient VG1 at the gate (G). The magnitude of the transient VG1 is proportional to the ratio of the gate-drain capacitance (Cgd) to the gate-source capacitance (Cgs) Cgd/Cgs. As a result, the transient VG1 may turn the transistor 1 ON briefly when not desired. This unwanted period of conduction may result in rather large power and efficiency losses. These problems are common in all FET devices whether they are silicon, non-silicon or IEMT devices.

Accordingly, it would be desirable to provide a transistor suitable for use in high voltage, high speed switching applications that avoids the problems discussed above.

SUMMARY OF THE INVENTION

A merged gate transistor in accordance with an embodiment of the present invention includes a semiconductor element, a supply electrode electrically connected to a top surface of the semiconductor element, drain electrode electrically connected to the top surface of the semiconductor element and spaced laterally away from the supply electrode, a first gate positioned between the supply electrode and the drain electrode and capacitively coupled to the semiconductor element to form a first portion of the transistor and a second gate positioned adjacent to the first gate, and between the supply electrode and the drain electrode to form a second portion of the transistor, wherein the second gate is also capacitively coupled to the semiconductor element. The first gate is connected to an input voltage signal such that conduction of the first portion is based on a value of the input voltage signal and the second gate is connected to a predetermined constant voltage such that the second portion of the transistor conducts until a voltage difference between the predetermined constant voltage and a voltage at the source electrode reaches a predetermined level.

A merged cascode high electron mobility transistor in accordance with an embodiment of the present invention includes a first epitaxial layer of III-Nitride material, a second epitaxial layer of a III-Nitride material, positioned on top of said first epitaxial layer such that a 2 dimensional electron gas conducting layer is formed between the first and second epitaxial layers, a supply electrode electrically connected to the first epitaxial layer, a drain electrode electrically connected to the first epitaxial layer and spaced laterally from the supply electrode, a first gate positioned between the supply electrode and the drain electrode and capacitively coupled to the first epitaxial layer to form a first portion of the transistor and a second gate positioned adjacent to the first gate, and between the drain electrode and the supply electrode and capacitively coupled to the first epitaxial layer to form a second portion of the transistor. The first gate is connected to an input voltage signal such that conduction of the first portion is based on a value of the input voltage signal and the second gate is connected to a predetermined constant voltage such that the second portion of the transistor conducts until a voltage difference between the predetermined constant voltage and a voltage at the source electrode reaches a predetermined level.

Embodiments and advantages of the present invention will become apparent from the following description of the invention which refers to the accompanying drawings.

DETAILED DESCRIPTION OF THE EMBODIMENTS

Figure 1:
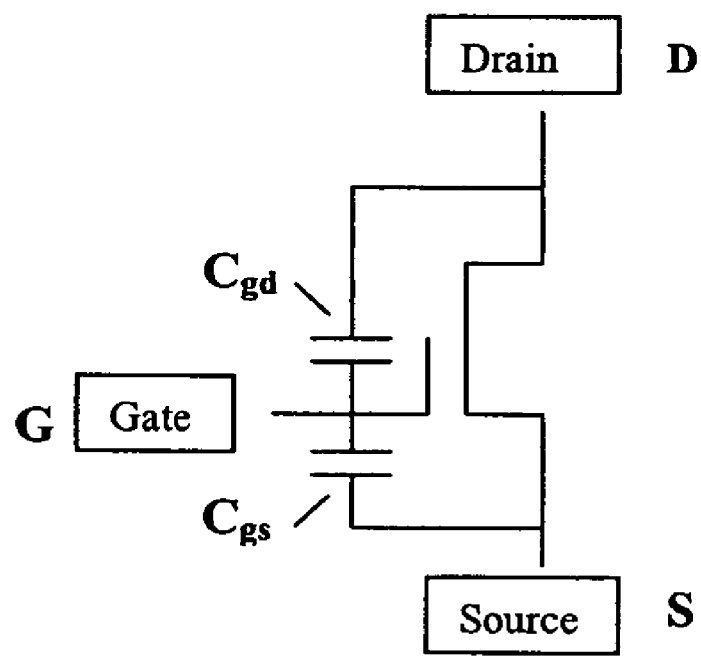
FIG. 1 illustrates a schematic view of a conventional FET.
Figure 2:
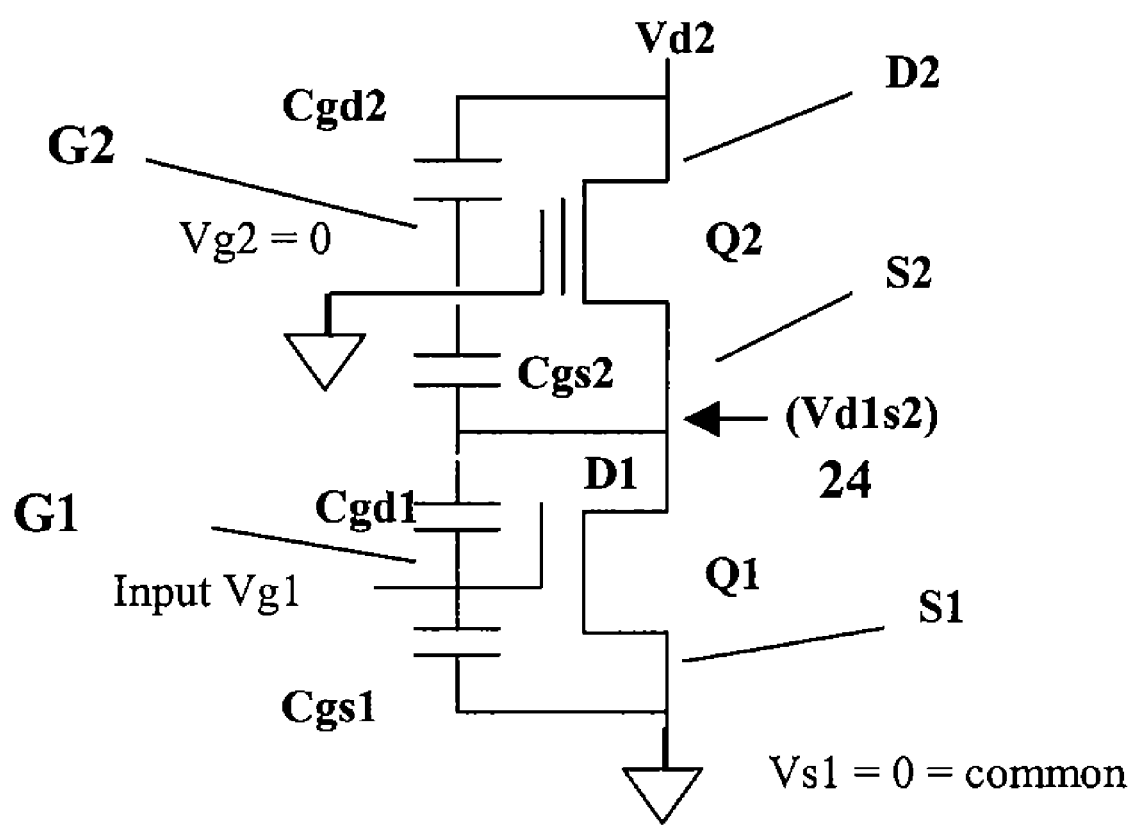
FIG. 2 illustrates a merged gate transistor in accordance with an embodiment of the present invention.

A transistor 20 suitable for use in high voltage, high speed switching applications in accordance with an embodiment of the present invention is described with reference to FIG. 2. A single FET 20 with two merged gates 22, 22$^1$ is illustrated in FIG. 2. That is, the FET 20 of FIG. 2 is a single device and not two separate FETs.

The top portion Q2 is in depletion mode, that is, normally ON with a depletion pinchoff voltage Vp2. The gate voltage Vg2 at the gate 22$^1$ of the top portion Q2 is set to 0, as illustrated. However, depending on the specific application, the gate voltage Vg2 may be set at any desired value.

The bottom portion Q1 of FET 20 is preferably in enhancement mode, that is, normally OFF, with an enhancement threshold voltage Vt1. An input voltage signal is preferably connected to the gate 22 to provide the gate voltage Vg1 at the gate 22 of the bottom portion Q1.

In operation, when the input voltage signal provides a high voltage at Vg1, the bottom portion Q1 is conducting. That is, the level of the input voltage signal is sufficiently high such that the enhancement threshold voltage Vt1 is met or exceeded and conduction occurs. The voltage at the node 24 (Vdls2) at this time is low, substantially 0V. As noted above, the voltage at the gate 22[1] (Vg2) is set to 0, and thus, the gate-source voltage of the top portion Q2 is approximately 0V, as well. Since the top portion Q2 is in depletion mode, Q2 is fully ON and is fully conducting. Thus, both the top and bottom portions Q1, Q2 of device 20 are both ON and conducting. Further, the voltage at the drain (Vd2) of portion Q2 is close to 0 as well.

When the input voltage at Vg1 and provided to the gate 22 of the bottom portion Q1 (Vg1) goes low, the bottom portion Q1 turns OFF and the bottom portion Q2 stops conducting. As a result, the voltage at the node 24 (Vdls2) rises until the gate-source voltage (Vgs) of the top portion Q2 reaches the pinch off voltage Vp2 and the top portion Q2 turns OFF. Thereafter, the drain voltage Vd2 of the top portion Q1 rises to the full supply voltage.

Thus, in the device 20, the voltage at node 24 (Vdls2) never rises above the magnitude of the pinchoff voltage Vp2. The pinchoff voltage Vp2 is preferably set low, on the order of a few volts and is typically much lower than the peak drain voltage Vd2, or supply voltage, which is generally 10s-100s of volts.

As a result, the drain swing of the bottom portion Q1 is substantially reduced, that is, a swing of only a few volts. This is a much smaller swing than would occur if a single FET were used alone as a switching device. As a result, Q1 need only be optimized for ultra-low voltage operation.

The FET 20 of the present invention offers several advantages. First, the "Miller effect" is greatly reduced, and thus power losses are also substantially reduced as well. The dV/dt at the drain (D1) of the bottom portion Q1 is also reduced, and thus, the capacitively coupled voltage transient VG1 is also reduced. As a result, the danger of shoot through is also substantially reduced. Further, since Q1 can be optimized for ultra-low voltage operation, short gate lengths (Lg) can be used which further reduce the overall gate charge of Q1 and improve switching performance. Since Q1 never has a high voltage on its drain (D1), Q1's gate does not need field plating which also reduces its capacitance. Q2 can be optimized for stable higher voltage operation, for example by field plating the gate. Ordinarily field plating the gate creates higher gate drain charge and high gate drain capacitance, however, since the gate G2 is grounded, any capacitively coupled shoot through voltage transient at G2 is relatively harmless such that unwanted conduction in the top portion Q2 is unlikely. While the configuration of FIG. 2 may lead to higher static Rdson, or DC conduction losses, the overall improved lower R Q figure of merit will result in lower overall power losses and higher efficiency.

Figure 3:
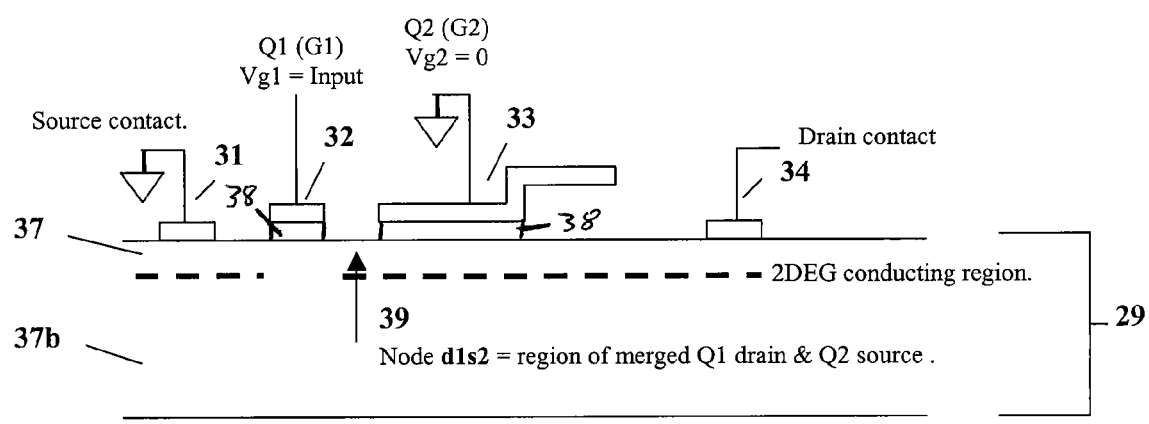
FIG. 3 illustrates an operative configuration for a transistor device in accordance with an embodiment of the present invention.

FIG. 3 illustrates an exemplary embodiment of a transistor 30 in accordance with an embodiment of the present invention preferably implemented as a high electron mobility transistor (IEMT). Specifically, FIG. 3 illustrated a merged cascode BEMT 30 in accordance with an embodiment of the present invention that may be fabricated with insulated gates and a semiconductor element 29 including two III-Nitride epitaxial layers (37, 37b) with a 2DEG conducting layer (28) at the interface of the epitaxial layers (37, 37b).

Generally, in the BEMT 30 of FIG. 3, the first (or bottom) portion Q1 is in enhancement mode such that the 2DEG is typically not present under the gate G1 when Vg1=0, as illustrated. This may be accomplished by using a recessed gate, fluorine implants or any other suitable means. As illustrated, a source contact 31 is positioned on a top surface of a semiconductor element 29, which may include the first epitaxial layer 37. The gates G1, G2 (32, 33) are position adjacent to the source contact 31 and are separated from the top surface of the first epitaxial layer 37 by an insulating layer 38. A drain contact 34 is positioned on the other side of the gates 32, 33 on the top surface of the first epitaxial layer 37. The node 24 of FIG. 2 is represented by the arrow 39 in the area of the merged Q1 drain and Q2 source. That is, on the drain side of the gate 32 (G1) of the first portion Q1 and on the source side of the gate 33 (Q2) of the second portion.

While specifically illustrated as an IEMT device in FIG. 3, it is noted that the first and second portions Q1, Q2 of the FET 20 may be fabricated using silicon, III-Nitride or may be a compound semiconductor, if desired. While the top portion Q2 is described as being in depletion mode and the bottom portion Q1 is described as being in enhancement mode, Q1 and Q2 may be in either depletion mode or in enhancement mode. Alternatively, both the first and second portion Q1, Q2 may be in the same mode, if desired.

The first and second portions Q1, Q2 may include insulated gates, shottky gates, or junction gates. Further, the polarity of the conducting channel may be either N-type or P-type. The voltage Vg2 at the gate 33 (G2) of portion Q2 may be set at some non-zero value, if desired, as is mentioned above.

Figure 4:
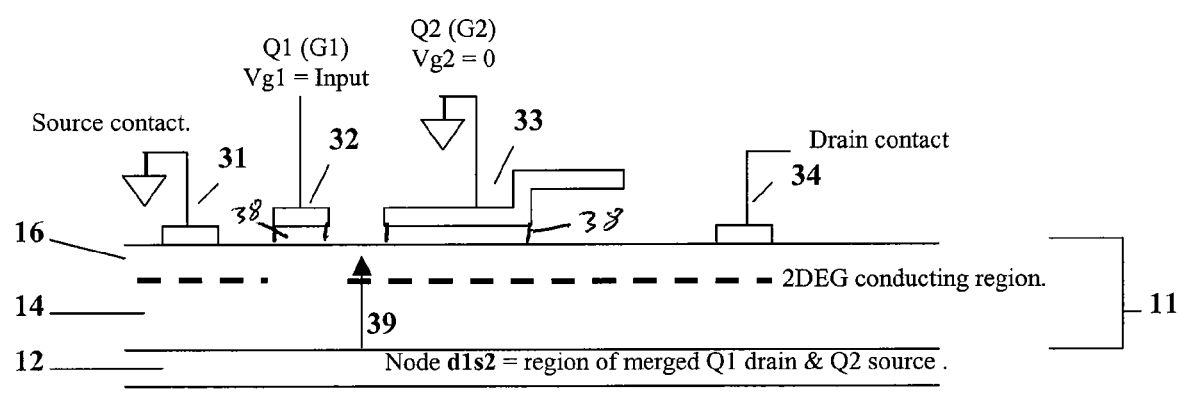
FIG. 4 illustrates an operative configuration for a transistor device in accordance with another embodiment of the present invention.

The device of FIG. 3 may include a III-nitride base heterojunction 10 disposed over a support body 12. FIG. 4 illustrates this embodiment and common reference numbers refer to common elements. The transistor 40 of FIG. 4 is similar to the switching device described in U.S. patent application Ser. No. 11/345,753, mentioned above. Heterojunction 11 includes a first III-nitride semiconductor body 14, and a second III-nitride semiconductor body 16 over first III-nitride semiconductor body 14. A first power electrode 31 (i.e. source electrode) and a second power electrode 34 (i.e. drain electrode) are electrically connected to second III-nitride semiconductor body 16 through a direct ohmic connection or any other suitable means. Two gate structures 32, 33 are disposed between electrodes 31, 34 over second III-nitride semiconductor body 16. In the preferred embodiment of the present invention, the gates 32, 33 are capacitively connected, or coupled, to second III-nitride semiconductor layer 16 through an insulating layer 38, for example. Alternatively, gate structures 32, 33 may include a schottky gate electrode connected to second III-nitride semiconductor body 16.

In a device according to any one of the embodiments of the present invention, the first III-nitride semiconductor body is preferably an alloy from the InAlGaN system, such as GaN, and the second III-nitride semiconductor body 16 is another alloy from the InAlGaN system having a band gap that is different from that of first III-nitride semiconductor 14, whereby a two-dimensional electron gas (2DEG) is formed due to the heterojunction of the first and the second III-nitride semiconductor bodies as is well known in the art. For example, the second III-nitride semiconductor body may be formed with AlGaN. However, other materials may be used if desired.

In addition, support body 12 may be a combination of a substrate material, and if required, a buffer layer (not shown) on the substrate to compensate for the lattice and thermal mismatch between the substrate and first III-nitride semiconductor body 14. For economic reasons, the preferred material for the substrate is silicon. Other substrate materials such as sapphire, and SiC can also be used without deviating from the scope and the spirit of the present invention.

AlN is a preferred material for a buffer layer, if necessary. However, a multi-layer or graded transitional III-nitride semiconductor body may also be used as a buffer layer without deviating from the scope and the spirit of the present invention.

It is also possible to have the substrate made from the same material as first III-nitride semiconductor body and thus avoid the need for a buffer layer. For example, a GaN substrate may be used when first III-nitride semiconductor body 14 is formed with GaN.

The gate electrodes 32, 33 may be composed of n type or p type silicon, or polysilicon of any desired conductivity, or TiW, aluminum, Ti/Al, refractory silicides, or other metallic layer. Ohmic electrodes 31, 34 may be composed of Ti/Al and may further include other metallic bodies over the top surface thereof such as Ti/TiW, Ni/Au, Mo/Au, or the like. Any other metal system that makes low resistance contact to the 2DEG may be employed. Gate insulating layer 38 may be composed of SiN, $Al_2O_3$, $SiO_2$, HfO, MgO, $Sc_2O_3$, or the like. Schottky metal for schottky electrode 26 may include nickel, platinum, palladium, silicides of those metals, or any other metal with sufficient barrier height to keep leakage low.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A merged cascode transistor circuit comprising:
an input voltage signal source having an input voltage signal;
a constant voltage source having a predetermined constant voltage;
a merged cascode transistor comprising:
a semiconductor element;
a source electrode electrically connected to a top surface of the semiconductor element;
a drain electrode electrically connected to the top surface of the semiconductor element and spaced laterally away from the source electrode;
a first gate positioned between the source electrode and the drain electrode and coupled to the semiconductor element to form a first portion of the transistor; and
a second gate positioned adjacent to the first gate, and between the source electrode and the drain electrode to form a second portion of the transistor, wherein the second gate includes a field plate and is also coupled to the semiconductor element;
wherein the first gate is connected to the input voltage signal source such that conduction of the first portion of the transistor is based on a value of the input voltage signal and the second gate is connected to the constant voltage source such that the second portion of the transistor conducts until a voltage difference between the predetermined constant voltage and a voltage at a node in the semiconductor element between the first portion and the second portion of the transistor reaches a predetermined level, wherein the first portion of the transistor is an enhancement mode transistor and the second portion of the transistor is a depletion mode transistor, and wherein a drain region of the enhancement mode transistor is merged with a source region of the depletion mode transistor at the node in the semiconductor element.

2. The merged cascode transistor of claim 1, wherein the semiconductor element further comprises:
a first III-Nitride layer; and
a second III-Nitride layer on which the first III-Nitride layer is positioned such that a 2DEG conduction layer forms between the first and second III-Nitride layers, wherein the source electrode and the drain electrode are ohmically connected to the first III-Nitride layer.

3. The merged cascode transistor of claim 2, further comprising an insulating layer positioned between the first and second gates and the first III-Nitride layer such that the first and second gates are capacitively coupled to the first III-Nitride layer.

4. The merged cascode transistor of claim 3, wherein the first III-Nitride layer comprises AlGaN material and the second III-Nitride layer comprises GaN material.

5. The merged cascode transistor of claim 4, further comprising an insulating layer positioned between the first and second gates and the first III-Nitride layer such that the first and second gates are capacitively coupled to the first III-Nitride layer.

6. The merged cascode transistor of claim 5, wherein the first portion of the transistor conducts when the input voltage signal provides an input voltage above a predetermined threshold voltage.

7. The merged cascode transistor of claim 6, where in the predetermined level is a pinch off voltage of the second portion of the transistor.

8. The merged cascode transistor of claim 7, wherein the insulation layer is comprised of silicon dioxide.

9. The merged cascode transistor of claim 8, wherein the insulation layer is comprised of silicon nitride.

10. A merged cascode high electron mobility transistor circuit comprises:
an input voltage signal source having an input voltage signal;
a constant voltage source having a predetermined constant voltage;
a merged cascode transistor comprising:
a first epitaxial layer of III-Nitride material;
a second epitaxial layer of a III-Nitride material in contact with the first epitaxial layer such that a 2-dimensional electron gas conducting layer is formed between the first and second epitaxial layers;
a source electrode electrically connected to the first epitaxial layer;
a drain electrode electrically connected to the first epitaxial layer and spaced laterally from the source electrode;
a first gate positioned between the source electrode and the drain electrode and coupled to the first epitaxial layer to form a first portion of the transistor; and
a second gate, including a field plate, positioned adjacent to the first gate, and between the drain electrode and source electrode and coupled to the first epitaxial layer to form a second portion of the transistor;
wherein the first gate is connected to the input voltage signal source such that conduction of the first portion is based on a value of the input voltage signal and the second gate is connected to the constant voltage source such that the second portion of the transistor conducts until a voltage difference between the predetermined constant voltage and a voltage at a node in the semiconductor element between the first portion and the second portion of the transistor reaches a predetermined level, wherein the first portion of the transistor is an enhancement mode transistor and the second portion of the transistor is a depletion mode transistor, and wherein a drain region of the enhancement mode transistor is merged with a source region of the depletion mode transistor at the node in the semiconductor element.

11. The merged cascode high electron mobility transistor of claim 10, further comprising an insulating layer positioned between the first and second gates and the first epitaxial layer.

12. The merged cascode high electron mobility transistor of claim 11, wherein the first epitaxial layer comprises an AlGaN material and the second epitaxial layer comprises a GaN material.

13. The merged cascode high electron mobility transistor of claim 12, wherein first portion of the transistor conducts when the input voltage signal provides an input voltage above a predetermined threshold voltage.

14. The merged cascode high electron mobility transistor of claim 13, wherein the predetermined level is a pinch off voltage of the second portion of the transistor.

15. The merged cascode high electron mobility transistor of claim 14, wherein the insulating layer is comprised of silicon dioxide.

16. The merged cascode high electron mobility transistor of claim 14, wherein the insulating layer is comprised of silicon nitride.

* * * * *